US010624245B2

United States Patent
Wang (10) Patent No.: US 10,624,245 B2
(45) Date of Patent: Apr. 14, 2020

(54) LASER WELDABLE BRACKETS FOR ATTACHMENT OF HEAT SINKS TO BOARD LEVEL SHIELDS

(71) Applicant: Laird Technologies, Inc., Earth City, MO (US)

(72) Inventor: Yu Jen Wang, Cupertino, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 377 days.

(21) Appl. No.: 15/591,786

(22) Filed: May 10, 2017

(65) Prior Publication Data

US 2017/0374770 A1 Dec. 28, 2017

Related U.S. Application Data

(60) Provisional application No. 62/354,565, filed on Jun. 24, 2016, provisional application No. 62/354,096, filed on Jun. 23, 2016.

(51) Int. Cl.
| | | |
|---|---|---|
| *H05K 9/00* | (2006.01) | |
| *H01L 23/552* | (2006.01) | |
| *H01L 23/367* | (2006.01) | |
| *B23K 26/21* | (2014.01) | |
| *H05K 1/02* | (2006.01) | |
| *B23K 101/42* | (2006.01) | |

(52) U.S. Cl.
CPC ........... *H05K 9/0024* (2013.01); *B23K 26/21* (2015.10); *H01L 23/3672* (2013.01); *H01L 23/552* (2013.01); *H05K 1/0204* (2013.01); *H05K 9/0032* (2013.01); *B23K 2101/42* (2018.08)

(58) Field of Classification Search
CPC .......................... H01L 23/4093; H05K 9/0028
See application file for complete search history.

(56) References Cited

U.S. PATENT DOCUMENTS

| | | | | |
|---|---|---|---|---|
| 5,411,199 A | * | 5/1995 | Suppelsa | H05K 5/0091 228/177 |
| 5,502,292 A | | 3/1996 | Pernicka et al. | |
| 5,619,609 A | * | 4/1997 | Pan | G02B 6/4226 385/136 |
| 6,341,065 B1 | | 1/2002 | Lo | |
| 6,343,015 B1 | | 1/2002 | Huang et al. | |
| 6,496,371 B2 | | 12/2002 | Winkel et al. | |

(Continued)

OTHER PUBLICATIONS

European Search Report for EP application No. 17176876.5 which claims priority to the same parent application as the instant application; dated Nov. 24, 2017; 5 pages.

*Primary Examiner* — Hung V Ngo (74) *Attorney, Agent, or Firm* — Harness, Dickey & Pierce, P.L.C.; Anthony G. Fussner (57) ABSTRACT

According to various aspects, exemplary embodiments are disclosed of laser weldable brackets for attachment of heat sinks to EMI shields, such as a board level shield, etc. In an exemplary embodiment, an assembly generally includes an electromagnetic interference (EMI) shield, a heat sink, and a bracket laser weldable to the EMI shield for attachment of the heat sink to the EMI shield. In another exemplary embodiment, a method of attaching a heat sink to an EMI generally includes laser welding a bracket to the EMI shield whereby the bracket retains the heat sink in place relative to the EMI shield.

23 Claims, 9 Drawing Sheets

(56) References Cited

U.S. PATENT DOCUMENTS

| | | | |
|---|---|---|---|
| 7,355,857 B2 * | 4/2008 | Pirillis | H05K 7/20418 |
| | | | 165/80.3 |
| 7,488,902 B2 | 2/2009 | English et al. | |
| 9,439,333 B2 | 9/2016 | Daughtry, Jr. et al. | |
| 2002/0007936 A1 | 1/2002 | Woerner et al. | |
| 2002/0075655 A1 | 6/2002 | Chen et al. | |
| 2002/0084060 A1 | 7/2002 | Sasaki et al. | |
| 2006/0203453 A1 | 9/2006 | Chen | |
| 2011/0255247 A1 * | 10/2011 | Chu | H01L 23/4093 |
| | | | 361/709 |
| 2015/0282388 A1 * | 10/2015 | Carpenter | H05K 9/0032 |
| | | | 361/720 |
| 2016/0100511 A1 * | 4/2016 | Kurz | H01L 21/4882 |
| | | | 174/377 |
| 2017/0238410 A1 * | 8/2017 | Li | C09J 9/02 |
| | | | 361/709 |

* cited by examiner

LASER WELDABLE BRACKETS FOR ATTACHMENT OF HEAT SINKS TO BOARD LEVEL SHIELDS

CROSS-REFERENCE TO RELATED APPLICATIONS

This application claims priority to and the benefit of U.S. Provisional Patent Application No. 62/354,096 filed Jun. 23, 2016.

This application also claims priority to and the benefit of U.S. Provisional Patent Application No. 62/354,565 filed Jun. 24, 2016.

The entire disclosures of the above applications are incorporated herein by reference.

FIELD

The present disclosure generally relates to laser weldable brackets for attachment of heat sinks to EMI shields, such as a board level shield (BLS), etc.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

It is typically difficult to attach a heat sink to a BLS without adhesive, a clip, or mechanical fasteners. Accordingly, disclosed herein are exemplary methods of attaching a heat sink (e.g., aluminum heat sink with fins, etc.) and a thermal interface material (TIM) to a board level shield (BLS) while maintaining relatively even pressure over the TIM. As disclosed herein, a supporting bracket is configured to constrain movement of the heat sink in the X and Y directions. In use, the bracket presses down on the heat sink and TIM and makes contact with the BLS. The bracket may then be laser welded to the BLS to complete the assembly as shown in the drawings.

Conventionally, a cure-in-place adhesive is typically used that needs pressure and temperature to cure, which may delaminate over time at elevated temperatures. In exemplary embodiments, the laser welded bracket ensures proper contact while curing. In contrast, a conventional two-point clip provides uneven pressure resulting in poor TIM performance in vertical mount applications. The laser welded brackets disclosed herein are suitable for vertical applications.

Also, in exemplary embodiments, laser welding provides reliable retention force (e.g., minimum retention force of 50 Newtons or 150 Newtons, etc.) to the heat sink even after a severe drop test. On the contrary, conventional clips usually detach during impact. Compared to mechanical fasteners, laser welding requires less BLS estate (area) which enables a more compact heat sink BLS assembly.

Figure 1:
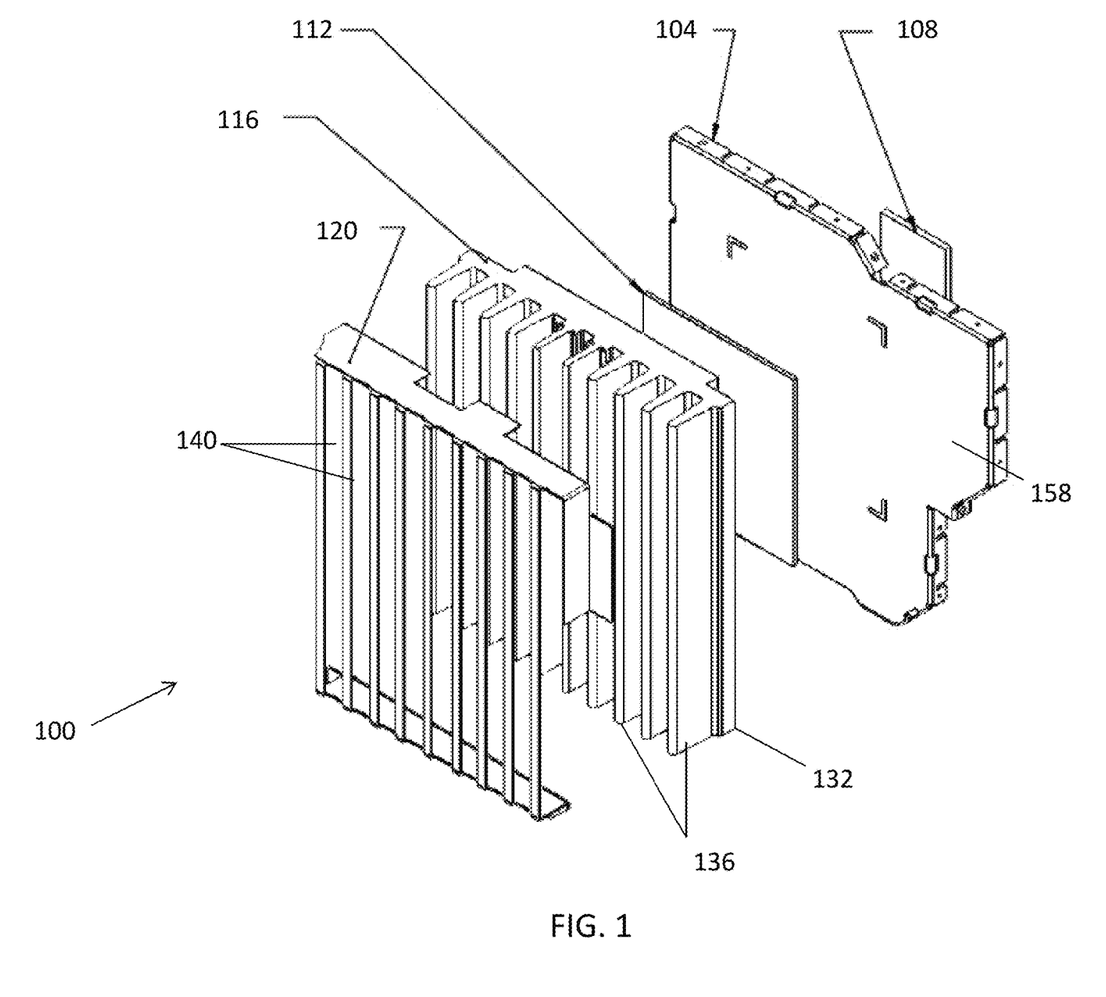
FIG. 1 is an exploded perspective view showing an exemplary embodiment of an assembly including a board level shield (BLS) cover or lid, first and second thermal interface materials, a heat sink, and a bracket (broadly, a retention component). The bracket is laser weldable to the BLS cover for attachment of the heat sink to the BLS cover with the second thermal interface material between the heat sink and the BLS cover according to an exemplary embodiment.

With reference now to the figures, FIG. 1 illustrates an exemplary embodiment of an assembly 100 embodying one or more aspects of the present disclosure. As shown, the assembly 100 includes a board level shield (BLS) cover or lid 104, a first thermal interface material 108 (TIM1), a second thermal interface material 112 (TIM2), a heat sink 116, and a bracket 120. As disclosed herein, the bracket 120 is laser weldable to the BLS cover 104 for attachment of the heat sink 116 to the BLS cover 104 with the second thermal interface material 112 between the heat sink 116 and the BLS cover 104. After being laser welded to the BLS cover 104, the bracket 120 retains the heat sink 116 in place and constrains movement of the heat sink 116 relative to the BLS cover 104. The bracket 120 also causes the second thermal interface material 112 to be compressed between the bottom surface of the heat sink 116 and the top surface of BLS cover 104.

FIGS. 7 and 8A-8E illustrate an exemplary fence or frame 124 to which the BLS cover 104 (FIG. 1) may be releasably attached or coupled. The fence 124 includes one or more sidewalls 126 (FIG. 7) configured for installation (e.g., soldering, etc.) to a printed circuit board (PCB) (broadly, a substrate) generally about one or more components on the PCB. In this example, the fence 124 includes a perimeter flange 125 extending inwardly from the top of the sidewalls 126. The fence 124 also includes a pickup surface or member 127 and cross members or supports 129 extending across an open top of the fence 124. Alternatively, the frame may be flangeless (without an inwardly extending flange) and/or may not include any pickup surface or cross members in other exemplary embodiments. Accordingly, the brackets and heat sinks disclosed herein should not be limited to use with any one specific BLS frame, fence, cover, or lid. For example, the brackets and heat sinks disclosed herein may also be used with one-piece board level shields that do not have a removable cover or lid. In some exemplary embodiments, the BLS may include one or more interior walls, dividers, or partitions that are attached to and/or integrally formed with the BLS. In such exemplary embodiments, the BLS cover, sidewalls, and interior walls may cooperatively define a plurality of individual EMI shielding compartments. Also, for example, the fence 124 may comprise a fence or frame as disclosed in U.S. Pat. No. 7,488,902, which is incorporated herein by reference.

Figure 5A:
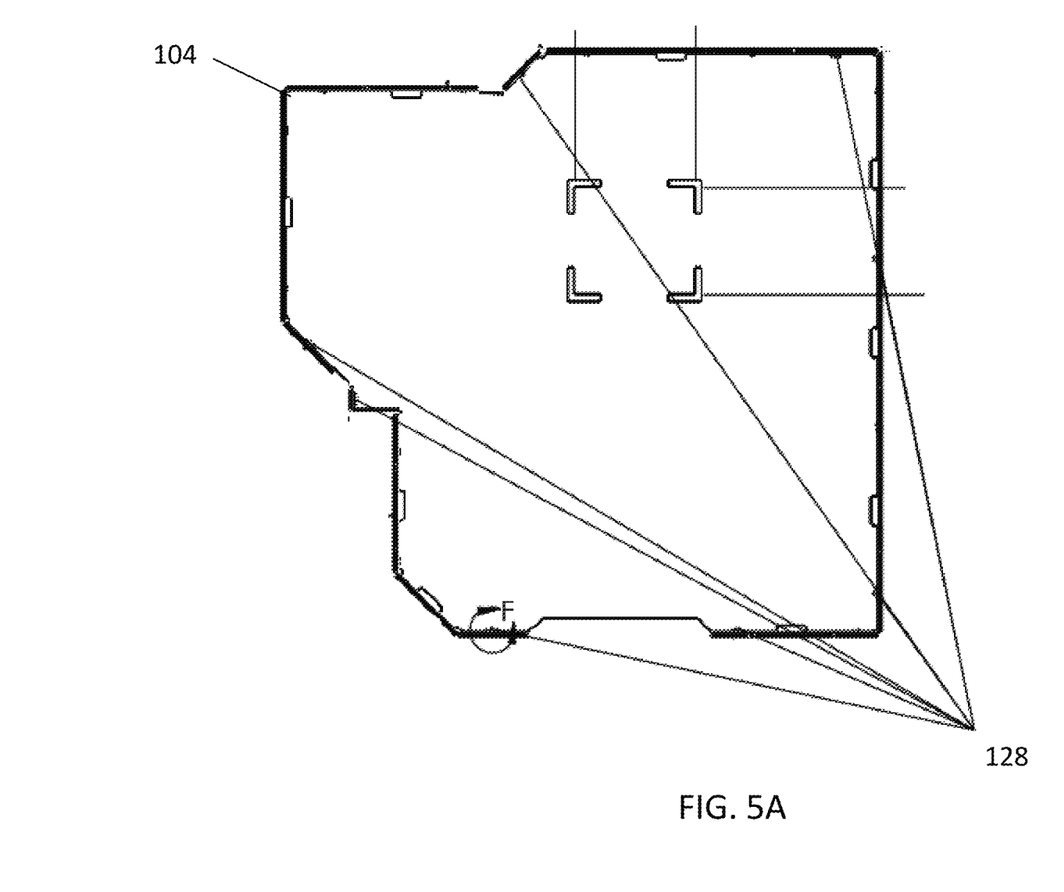
FIG. 5A is another bottom view of the BLS cover and first thermal interface material shown in FIG. 1.
Figure 5B:
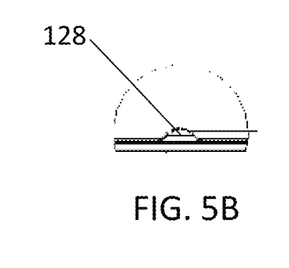
FIG. 5B illustrates one of the locking dimples (broadly, outwardly protruding portions or protrusions) of the BLS cover that is circled F in FIG. 5A.
Figure 8A:
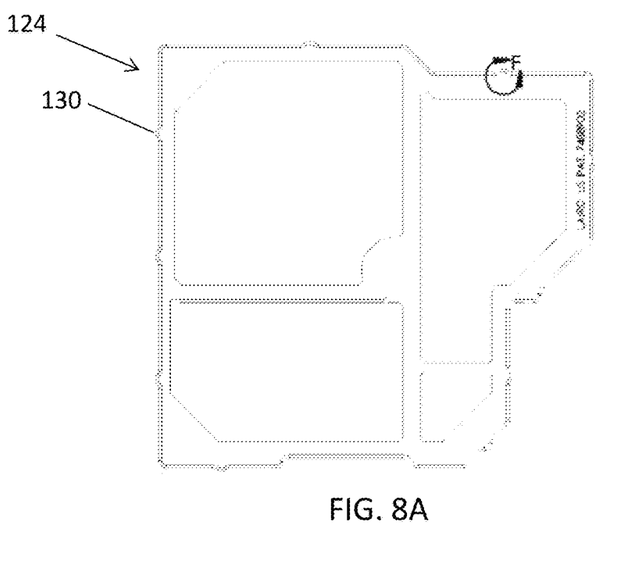
FIGS. 8A through 8E include a top view and side views of the fence or frame shown in FIG. 7.
Figure 8B:
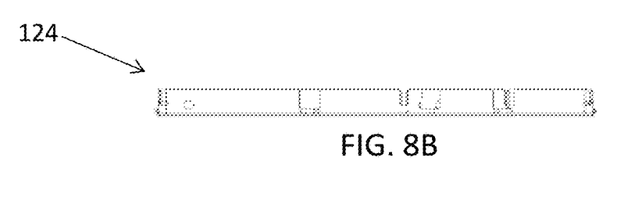
Figure 8C:
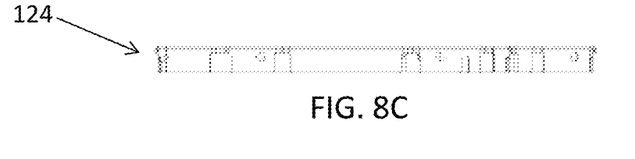
Figure 8D:
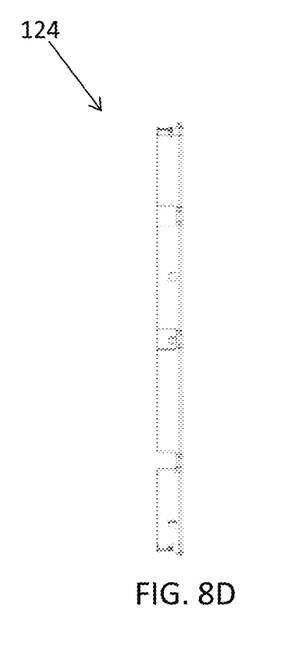
Figure 8E:
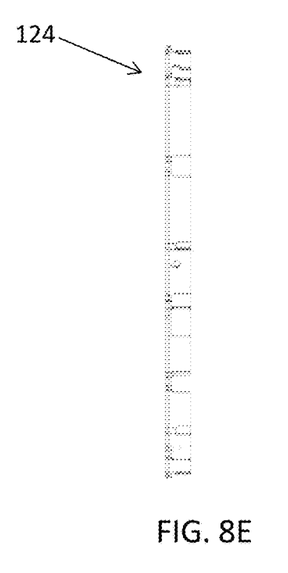
Figure 8F:
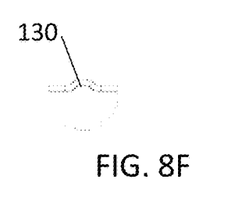
FIG. 8F illustrates one of the latching surfaces (broadly, outwardly protruding surfaces or protrusions) of the fence or frame that is circled F in FIG. 8A under which a corresponding locking dimple of the BLS cover shown in FIG. 5A may be positioned to thereby releasably attach or couple the BLS cover to the fence according to an exemplary embodiment.

As shown in FIGS. 5A and 5B, the BLS cover 104 includes locking dimples 128 (broadly, outwardly protruding portions or protrusions). The fence 124 includes latching surfaces 130 (broadly, outwardly protruding surfaces or protrusions) as shown in FIGS. 8A and 8F. The cover's locking dimples 128 may be positioned under corresponding latching surfaces 130 of the fence 124 to thereby releasably attach or couple the BLS cover 104 to the fence 124.

Figure 6A:
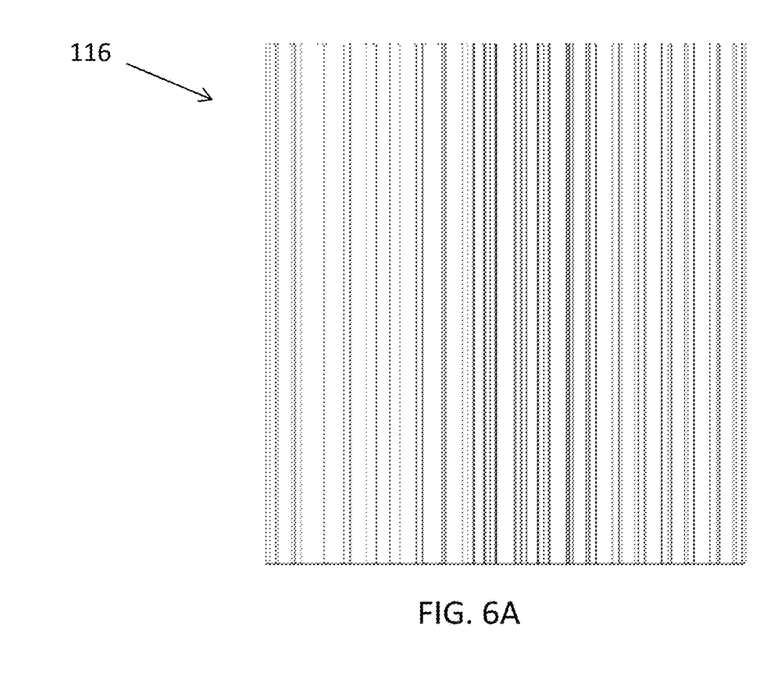
FIGS. 6A, 6B, and 6C include a top view and side views of the heat sink shown in FIG. 1.
Figure 6B:
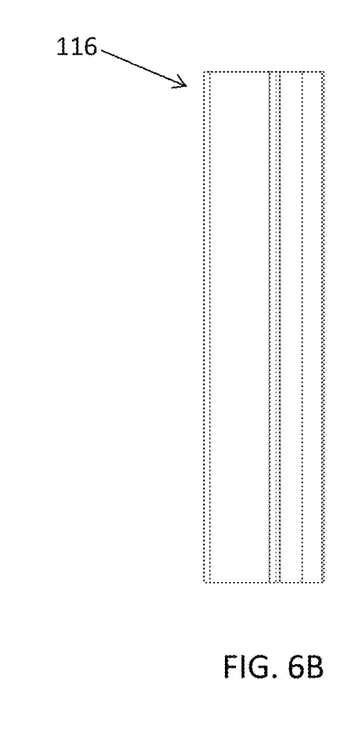
Figure 6C:
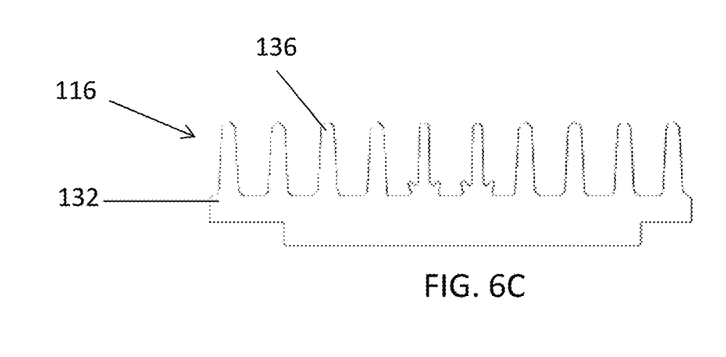
Figure 7:
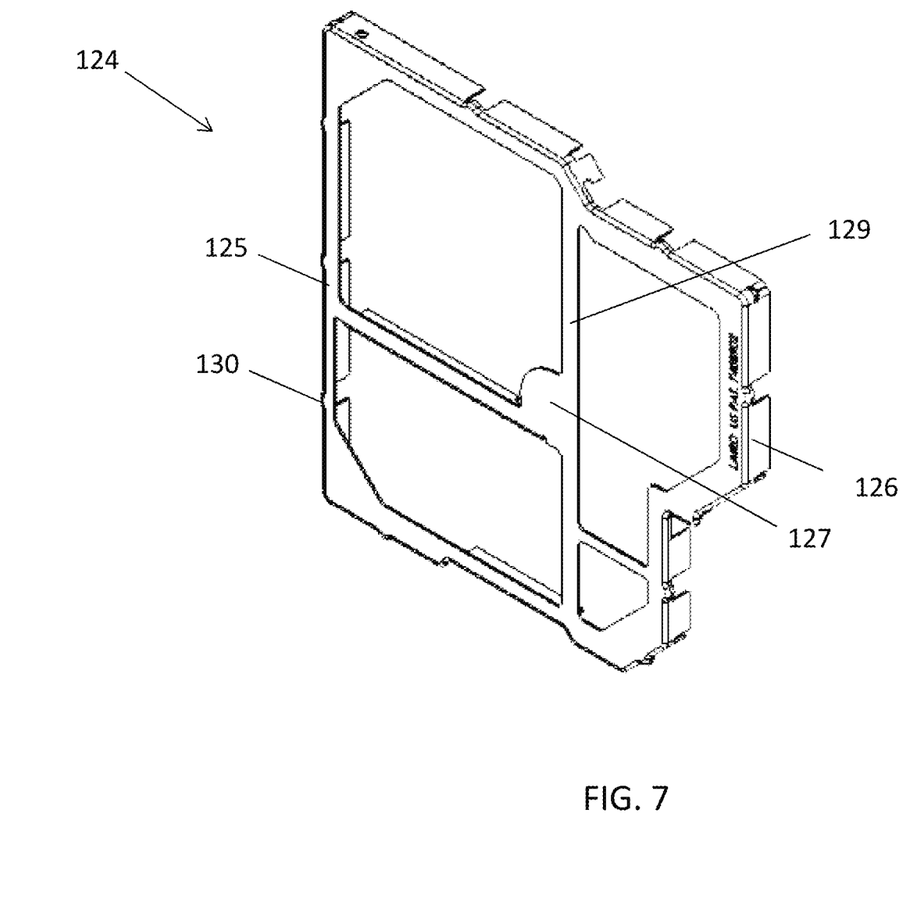
FIG. 7 is a perspective of a fence or frame to which the BLS cover shown in FIG. 1 may be releasably attached or coupled via the locking dimples shown in FIG. 5 according to an exemplary embodiment.

As shown in FIGS. 1 and 6, the heat sink 116 generally includes a rectangular base 132 with a series of spaced-apart fins 136 protruding upwardly or outwardly from the base 132. The fins 136 may be substantially parallel panels of material (e.g., aluminum, etc.), which may be the same material as the base 132. In this example, the heat sink 116 includes ten spaced-apart fins 136. Alternatively, the heat sink 116 may have a different configuration, e.g., include more or less than ten fins, have a multi-piece construction, have a non-rectangular base, etc.

Figure 2:
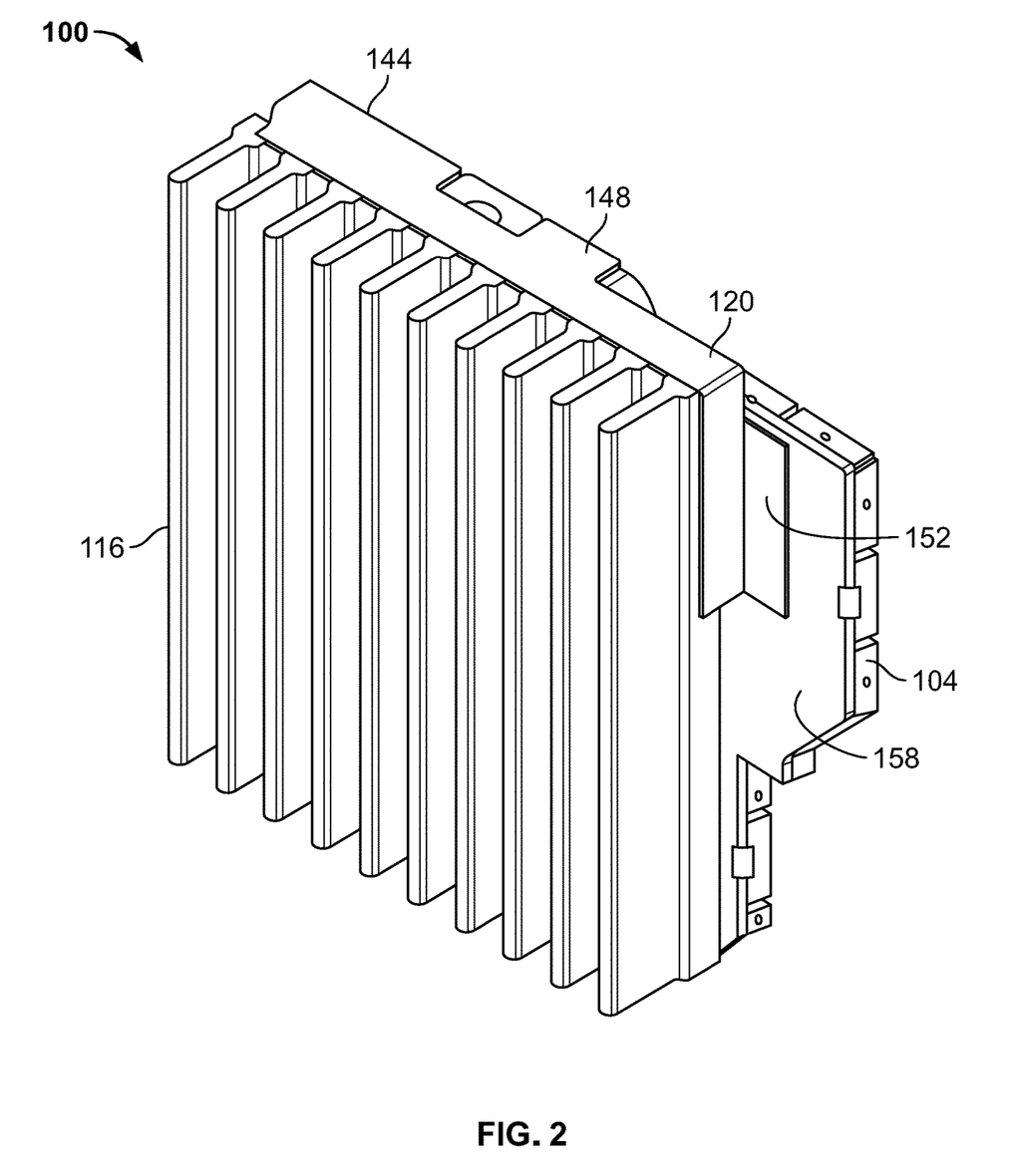
FIG. 2 is a perspective view of the assembly shown in FIG. 1 after being assembled with the bracket laser welded to the BLS cover to thereby retain the heat sink in place (e.g., constrain movement of the heat sink in the X and Y directions, etc.). The second thermal interface material is compressed between the heat sink and the BLS cover.

As shown in FIG. 1, the bracket 120 includes a plurality of slots 140 (broadly, openings) for receiving heat sink fins 136 therethrough. In this exemplary embodiment, the bracket 120 includes eight rectangular slots 140 for receiving eight of the heat sink fins 136 when the bracket 120 is positioned over the heat sink 116 as shown in FIGS. 2 and 3C. The two outermost fins 136 of the heat sink 116 are not positioned within any of the slots 140.

Figure 3A:
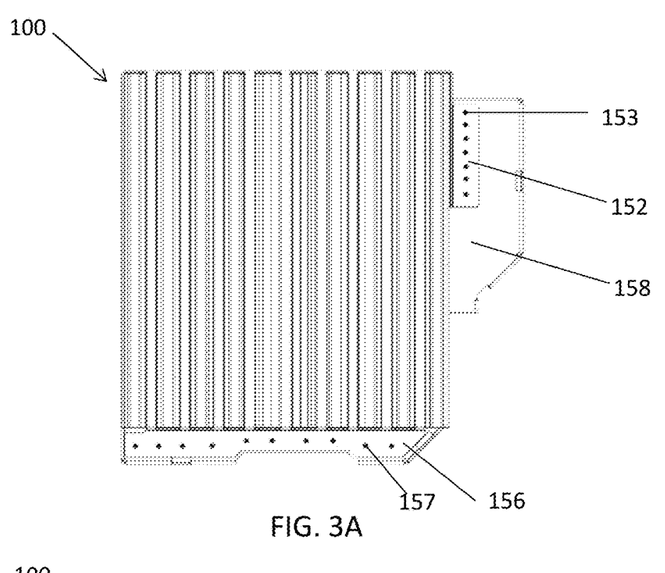
FIGS. 3A through 3E include a top view and side views of the assembly shown in FIG. 2. The small circles or dots in FIGS. 3A and 3B represent possible laser weld spot locations for laser welding the bracket to the BLS cover according to an exemplary embodiment.
Figure 3B:
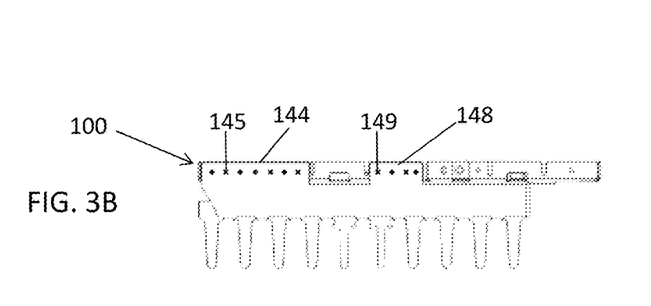
Figure 3C:
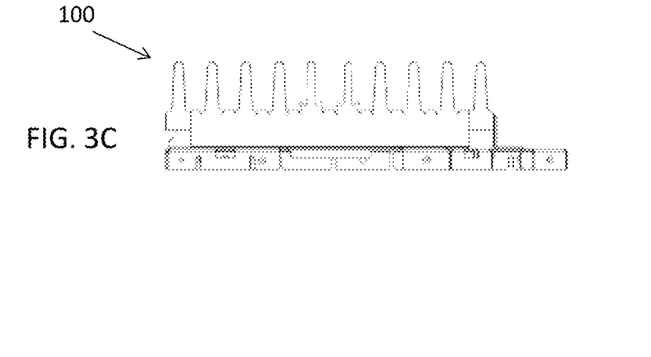
Figure 3D:
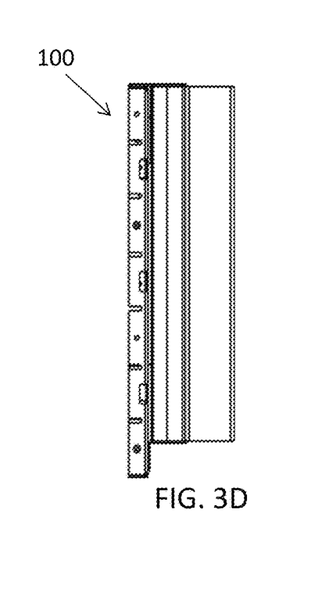
Figure 3E:
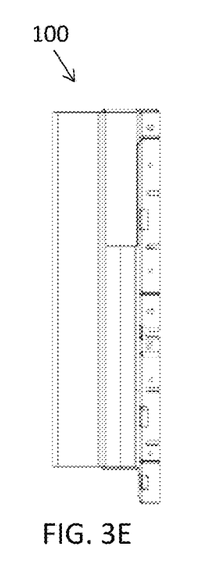

As shown in FIGS. 3A and 3B, the bracket 120 includes surfaces 144, 148, 152, and 156 having laser weld spot locations. The surfaces 144, 148, 152, 156 are generally flat planar surfaces that abut against corresponding portions of the BLS cover 104 when the bracket 120 is positioned over the heat sink 116 and the second thermal interface material 112 is compressed between the heat sink 116 and the top or upper surface 158 of the BLS cover 104. The surfaces 144, 148, 152, 156 are generally perpendicular to the top or upper surface 158 of the BLS cover 104 and the heat sink fins 136.

The small circles or dots in FIGS. 3A and 3B represent possible laser weld spot locations for laser welding the bracket 120 to the BLS cover 104. In this example, the first bracket surface 144 has seven laser weld spot locations 145. The second bracket surface 148 has four laser weld spot locations 149. The third bracket surface 152 has seven laser weld spot locations 153. The fourth bracket surface 156 has ten laser weld spot locations 157.

Figure 9:
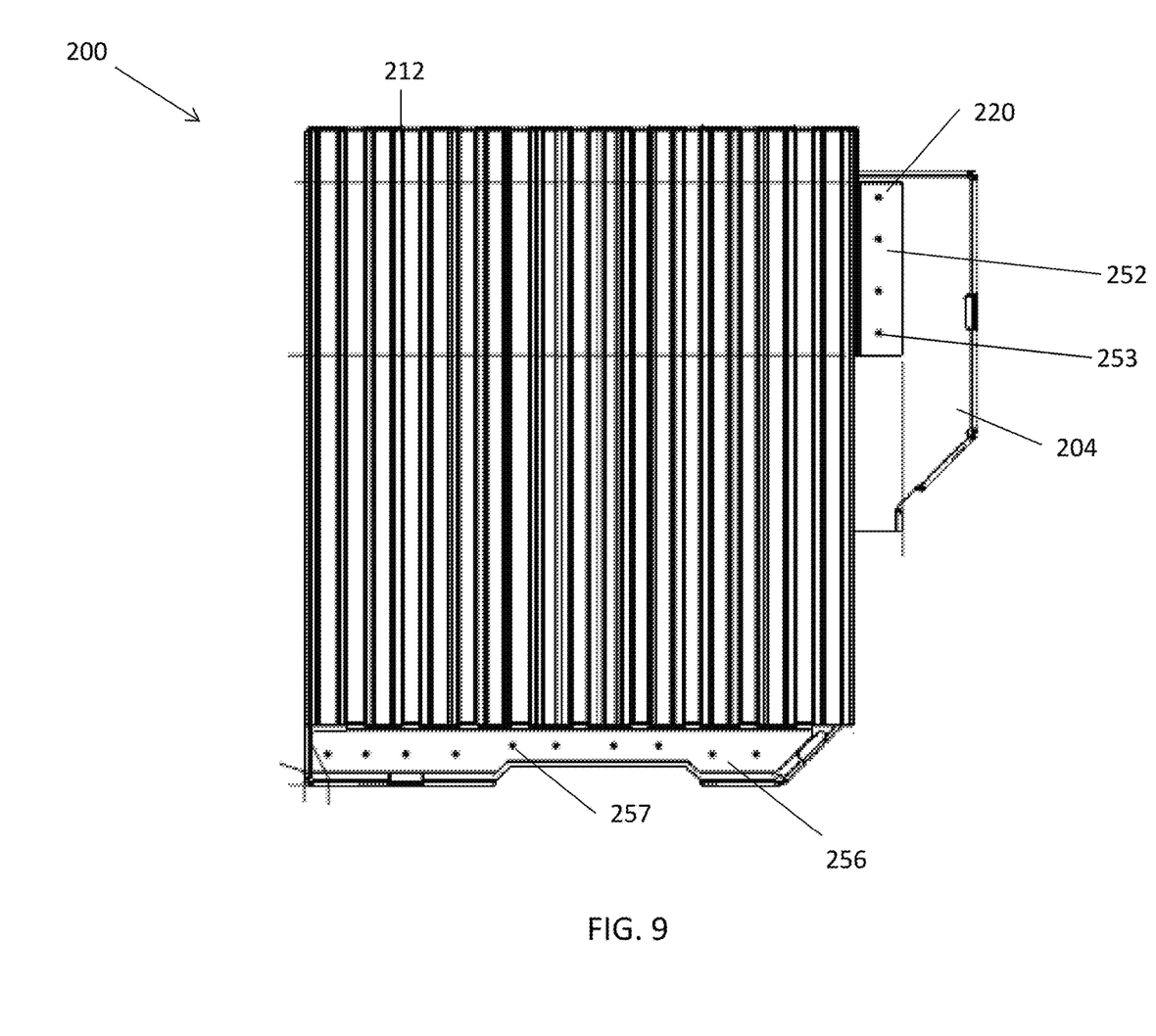
FIG. 9 is a top view of an assembly according to another exemplary embodiment that includes a board level shield (BLS) cover or lid, a heat sink, and a bracket. The bracket is laser weldable to the BLS cover for attachment of the heat sink to the BLS cover. The small circles or dots represent possible laser weld spot locations for laser welding the bracket to the BLS cover according to an exemplary embodiment.

In this particular example, the minimum retention after laser welding is about 150 Newtons. Alternative embodiments may have more or less laser weld spot locations depending, for example, on how much retention force is required. For example, FIG. 9 illustrates another exemplary embodiment that includes a board level shield cover 204, a heat sink 212, and bracket 220. The bracket 220 has a surface 252 with four laser weld spot locations 253 instead of seven. The bracket 220 also includes a surface 256 with ten laser weld spot locations 257.

In exemplary embodiments, an electronic device may include a printed circuit board having one or more components thereon. A board level shield may be positioned relative to the printed circuit board such that the one or more components are within an interior defined by the board level shield. A first thermal interface material may be compressed against at least one component of the one or more components such that a thermally-conductive heat path is defined from the at least one component through the first thermal interface material, a cover of the board level shield, and a second thermal interface material to a heat sink. A bracket may be laser welded to the cover of the board level shield to retain the heat sink in place relative to the cover.

In additional exemplary embodiments, a method may generally include positioning an EMI shield relative to a printed circuit board having one or more components such that the one or more components are within an interior defined by the EMI shield. A first thermal interface material may be between the EMI shield and at least one component of the one or more components. A second thermal interface material may between the EMI shield and a heat sink. The heat sink may be retained in place by a bracket that is laser welded to the EMI shield. A thermally-conductive heat path may be defined from the at least one component through the first thermal interface material, the EMI shield, and the second thermal interface material to the heat sink.

Other exemplary embodiments include methods for attaching a heat sink to an EMI shield, such as a board level shield. In an exemplary embodiment, a method generally includes laser welding a bracket to an EMI shield whereby the bracket retains a heat sink in place relative to the EMI shield. The method may also include before laser welding, positioning the bracket over the heat sink such that fins of the heat sink are received within openings of the bracket.

The bracket may include one or more surfaces that abut against and are generally perpendicular to the fins of the heat sink and corresponding portions of the EMI shield when the bracket is positioned over the heat sink. The method may include laser welding at the one or more surfaces of the bracket.

The EMI shield may comprise a board level shield. The method may include laser welding the bracket to the board level shield to thereby retain the heat sink in place relative to the board level shield.

The board level shield may comprise a fence and a cover releasably attachable to the fence. The method may include laser welding the bracket to the cover to thereby retain the heat sink in place relative to the cover.

The method may include compressing a thermal interface material between the heat sink and the EMI shield.

The method may further comprise positioning the EMI shield relative to a printed circuit board having one or more components such that the one or more components are within an interior defined by the EMI shield, a first thermal interface material is compressed between the EMI shield and at least one component of the one or more components, and a thermally-conductive heat path is defined from the at least one component through the first thermal interface material, the EMI shield, and the second thermal interface material to the heat sink.

A wide range of materials may be used in exemplary embodiments for the heat sink (e.g., 116 in FIG. 1, 216 in FIG. 9, etc.) and the bracket (e.g., 120 in FIG. 1, 220 in FIG. 9, etc.). For example, the heat sink may be aluminum while the bracket may be a laser weldable metal, laser weldable alloy, other suitable laser weldable material, etc.

The BLS frame, fence, or sidewalls (e.g., fence 124 in FIGS. 7 and 8, etc.) may be made of a wide range of materials in exemplary embodiments. By way of example, a non-exhaustive list of exemplary materials from which the BLS may be made include cold rolled steel (e.g., 1010/1080 CRS, etc.), nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. At least a portion of the BLS may be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc. For example, the BLS cover may be electrically conductive and thermally conductive such that a heat path is defined from the first thermal interface material, through the BLS cover to the second thermal interface material. The materials disclosed in this application are provided herein for purposes of illustration only, as different materials may be used depending, for example, on the particular application, such as the components to be shielded, space considerations within the overall device, EMI shielding and heat dissipation needs, and other factors.

Figure 4A:
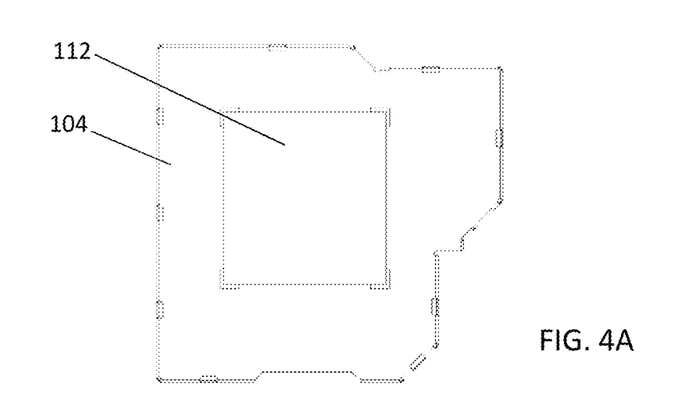
FIG. 4A is a top view of the BLS cover and second thermal interface material shown in FIG. 1.
Figure 4B:
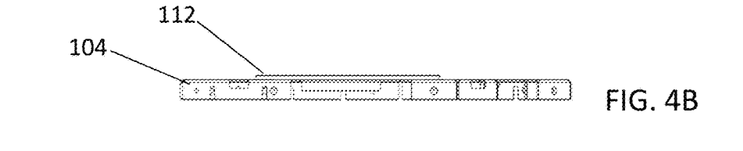
FIG. 4B is a side view of the BLS cover and second thermal interface material shown in FIG. 4A.
Figure 4C:
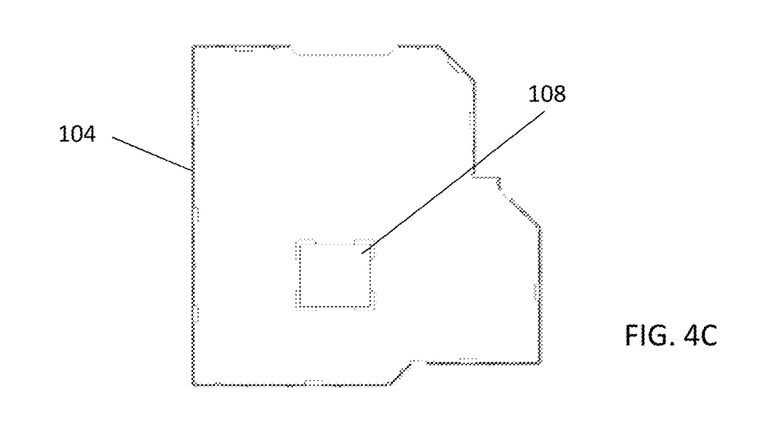
FIG. 4C is a bottom view of the BLS cover and first thermal interface material shown in FIG. 1.

A wide range of thermal interface materials may be used in exemplary embodiments for the first and second thermal interface materials 108, 112 shown in FIG. 1. For example, the first thermal interface material 108 underneath the BLS cover 104 that will between the BLS cover 104 and the PCB components may comprise a Tflex™ series gap filler (e.g., Tflex™ HD440, etc.). In the illustrated embodiment shown in FIG. 1, the first thermal interface material 108 comprises a compliant gap filler thermal interface material made of boron nitride and/or ceramic filled elastomer, which has a thickness of about 0.040 inches and an extended release liner that extends towards an edge of the BLS cover 104 as shown in FIG. 4C.

Also by way of example, the second thermal interface material 112 between the heat sink 116 and the BLS 104 may also comprise a Tflex™ series gap filler (e.g., Tflex™ HR420, etc.). In the illustrated embodiment shown in FIG. 1, the second thermal interface material 112 comprises a compliant gap filler thermal interface material made of ceramic filled elastomer, which has a thermal conductivity of 1.8 W/mk, has a thickness of about 0.020 inches, is naturally tacky on both sides needing no further additional adhesive coating, has a UL94 V0 flame rating, and hardness of about 60 Shore 00 as determined by ASTM D2240.

With reference to FIG. 9, the assembly 200 may include a first thermal interface material underneath the BLS cover 204 that will between the BLS cover 204 and the PCB components. The first thermal interface material may comprise a Tputty™ series thermal gap fillers (e.g., Tputty™ 502, etc.). For example, the first thermal interface material of the assembly 200 may comprise reinforced boron nitride filled silicone elastomer, which has a thickness of about 0.030 inches, a thermal conductivity of 3 W/mk, and is naturally tacky on both sides needing no further additional adhesive coating.

The assembly 200 may also include a second thermal interface material between the heat sink 116 and the BLS 104 may also comprise a Tflex™ series gap filler (e.g., Tflex™ HR420, etc.). The second thermal interface material may comprise a compliant gap filler thermal interface material made of ceramic filled elastomer, which has a thermal conductivity of 1.8 W/mk, has a thickness of about 0.020 inches, is naturally tacky on both sides, has a UL94 V0 flame rating, and hardness of about 60 Shore 00 as determined by ASTM D2240.

Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc. Example embodiments may include one or more thermal interface materials of Laird, such as any one or more of the Tputty™ series thermal gap fillers (e.g., Tputty™ 403, 504, 506, or 508 dispensable thermal interface materials, etc.), Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc.

In some exemplary embodiments, the first and/or second thermal interface materials may comprise a compliant gap filler having high thermal conductivity. By way of example, the first and/or second thermal interface materials may comprise a dispensable thermal interface material of Laird, such as one or more of Tflex™ CR200, Tputty™ 403, Tputty™ 504, and/or Tputty™ 506 dispensable thermal gap fillers. The first and/or second thermal interface materials may comprise a two-part cure in place ceramic filled silicone-based thermal gap filler that is curable at room temperature, has a low viscosity (e.g., 260,000 cps before mixing, etc.), good thermal conductivity (e.g., about 2 W/mk, etc.), and that is soft and compliant (e.g., hardness (Shore 00) 3 second of 45, etc.). As another example, the first and/or second thermal interface materials may comprise a single-part silicone-based thermal gap filler that is soft, compliant, and low abrasion and that has good thermal conductivity (e.g., about 2.3 W/mk, etc.). As a further example, the first and/or second thermal interface materials may comprise a soft silicone-based thermal gap filler that is a ceramic-filled dispensable silicone gel, that is soft and compliant, that has good thermal conductivity (e.g., about 1.8 W/mk, etc.), that can be applied like grease, and that is easily dispensable from equipment such as screen print, syringe, and automated equipment. As yet a further example, the first and/or second thermal interface materials may comprise a soft single-part silicone putty thermal gap filler in which no cure is required, that has good thermal conductivity (e.g., about 3.5 W/mk, etc.), and that is soft, compliant, non-abrasive, and dispensable.

In some exemplary embodiments, the first and/or second thermal interface materials may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers. For example, the first and/or second thermal interface materials may comprise a filled (e.g., alumina, ceramic, boron nitride, etc.) silicone elastomer gap filler that is soft, compliant, free-standing, and/or naturally tacky for adhesion during assembly and transport, and has good thermal conductivity (e.g., about 1.1 W/mk, 1.2 W/mK, 1.6 W/mk, 2.8, W/mK, 3 W/mK, 5 W/mK, etc.). As another example, the first and/or second thermal interface materials may comprise a filled silicone elastomer gel that has good thermal conductivity (e.g., about 1.2 W/mK, 1.8 W/mk, etc.) and that may also include a silicone liner or other dielectric barrier. As a further example, the first and/or second thermal interface materials may comprise a ceramic-filled silicone-free gap filler that has good thermal conductivity (e.g., about 7.8 W/mk, etc.) and a flammability rating of UL94 V0 and/or is naturally tacky.

In some exemplary embodiments, multiple different thermal interface materials may be disposed along either or both sides of a BLS cover or lid. The multiple different thermal interface materials along the lower side of the BLS cover or lid may have different thicknesses to accommodate for varying heights of the devices, components, etc., that will be under the BLS. The multiple different thermal interface materials along the upper side of the BLS cover or lid may also have different thicknesses to accommodate for varying thicknesses of the heat spreader or other heat removal/dissipation structures.

The thermal interface materials disclosed herein may comprise an elastomer and/or ceramic particles, metal particles, ferrite EMI/RFI absorbing particles, metal or fiberglass meshes in a base of rubber, gel, or wax, etc. The thermal interface materials may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The thermal interface materials may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The first and/or second thermal interface materials may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the first and/or second thermal interface materials may include ceramic filled silicone elastomer, boron nitride filled silicone elastomer, fiberglass reinforced gap filler, or a thermal phase change material that includes a generally non-reinforced film. The first and/or second thermal interface materials may have a relatively low Young's modulus and Hardness Shore value (e.g., Shore 00 hardness of 25, 40, 60, 70, 75, less than 100, less than 25, greater than 75, between 25 and 75 Shore 00, etc.).

Exemplary embodiments may include one or more thermal interface materials having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values between 1 and 6 W/mk. Accordingly, aspects of the present disclosure should not be limited to use with any particular thermal interface material as exemplary embodiments may include a wide range of thermal interface materials.

Example embodiments disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. An assembly comprising:
an electromagnetic interference (EMI) shield;
a heat sink; and
a bracket laser welded to the EMI shield to thereby attach the heat sink to the EMI shield;
wherein:
the heat sink includes a base and plurality of spaced-apart fins protruding outwardly from the base; and
the bracket includes a plurality of openings in which corresponding ones of the fins are received.

2. The assembly of claim 1, wherein:
the EMI shield comprises a fence and a cover releasably attachable to the fence; and
the bracket is laser welded to the cover to thereby retain the heat sink in place relative to the cover.

3. The assembly of claim 1, wherein:
the fins comprise substantially parallel rectangular panels of material;
the openings of the bracket comprise rectangular slots each receiving a corresponding individual one of the rectangular panels of material; and
the heat sink includes outermost fins that are not positioned within any of the rectangular slots of the bracket.

4. The assembly of claim 1, wherein the bracket includes one or more surfaces including a plurality of laser weld spot locations laser welded to the EMI shield.

5. The assembly of claim 4, wherein the one or more surfaces of the bracket are generally flat planar surfaces that abut against and are generally perpendicular to corresponding portions of the EMI shield.

6. The assembly of claim 4, wherein the one or more surfaces of the bracket comprise:
a first bracket surface having one or more laser weld spot locations;
a second bracket surface having one or more laser weld spot locations;
a third bracket surface having one or more laser weld spot locations; and
a fourth bracket surface having one or more laser weld spot locations.

7. The assembly of claim 6, wherein:
the first bracket surface includes two or more laser weld spot locations;
the second bracket surface includes two or more laser weld spot locations;
the third bracket surface includes two or more laser weld spot locations; and
the fourth bracket surface includes two or more laser weld spot locations.

8. The assembly of claim 1, wherein a minimum retention force is about 150 Newtons after the bracket is laser welded to the EMI shield.

9. The assembly of claim 1, wherein:
the EMI shield comprises a board level shield; and
the bracket is laser welded to the board level shield to thereby retain the heat sink in place relative to the board level shield.

10. The assembly of claim 9, wherein:
the board level shield comprises a cover; and
the bracket is laser welded to the cover to thereby retain the heat sink in place relative to the cover.

11. The assembly of claim 10, wherein:
the openings of the bracket include a plurality of slots in which corresponding individual ones of the fins are received except for outermost fins of the heat sink that are not positioned within any of the slots of the bracket; and
the bracket includes one or more surfaces laser welded to the EMI shield that are generally perpendicular to the fins of the heat sink and to an upper surface of the cover of the board level shield.

12. The assembly of claim 10, wherein:
the board level shield comprises a fence, and the cover is releasably attachable to the fence; and
the assembly further comprises a first thermal interface material between a lower surface of the heat sink and an outer surface of the cover, and a second thermal interface material along an inner surface of the cover.

13. The assembly of claim 10, further comprising:
a thermally-conductive compliant gap filler including elastomer and thermally-conductive filler and that is compressed between a lower surface of the heat sink and an outer surface of the cover; and/or
a thermally-conductive putty compressed between an inner surface of the cover and at least one component on a printed circuit board when the at least one component is within an interior defined by the board level shield.

14. The assembly of claim 1, wherein the bracket includes one or more bracket surfaces each including a plurality of laser weld spot locations laser welded to the EMI shield.

15. The assembly of claim 14, wherein the one or more bracket surfaces comprise one or more generally flat planar surfaces that abut against and are generally perpendicular to corresponding portions of the EMI shield.

16. The assembly of claim 14, wherein the one or more bracket surfaces comprise:
a first bracket surface having a plurality of laser weld spot locations;
a second bracket surface having a plurality of laser weld spot locations;
a third bracket surface having a plurality of laser weld spot locations; and
a fourth bracket surface having a plurality of laser weld spot locations.

17. The assembly of claim 1, wherein the bracket comprises more than two bracket surfaces including a plurality of laser weld spot locations laser welded to the EMI shield.

18. An assembly comprising:
an electromagnetic interference (EMI) shield;
a heat sink; and
a bracket laser weldable to the EMI shield for attachment of the heat sink to the EMI shield;
wherein the bracket includes one or more surfaces configured to be laser welded to the EMI shield; and
wherein the one or more surfaces of the bracket comprise:
a first bracket surface having seven laser weld spot locations;
a second bracket surface having four laser weld spot locations;
a third bracket surface having four or seven laser weld spot locations; and
a fourth bracket surface having ten laser weld spot locations.

19. An assembly comprising:
an electromagnetic interference (EMI) shield comprising a fence and a cover releasably attachable to the fence;
a heat sink; and
a bracket laser welded to the cover to thereby retain the heat sink in place relative to the cover.

20. The assembly of claim 19, wherein the bracket includes:
a first bracket surface having one or more laser weld spot locations;
a second bracket surface having one or more laser weld spot locations;
a third bracket surface having one or more laser weld spot locations; and
a fourth bracket surface having one or more laser weld spot locations.

21. The assembly of claim 20, wherein:
the first bracket surface includes two or more laser weld spot locations;
the second bracket surface includes two or more laser weld spot locations;
the third bracket surface includes two or more laser weld spot locations; and
the fourth bracket surface includes two or more laser weld spot locations.

22. The assembly of claim 21, wherein:
the first bracket surface includes at least four laser weld spot locations;
the second bracket surface includes at least four laser weld spot locations;
the third bracket surface includes at least four laser weld spot locations;
the fourth bracket surface includes at least four laser weld spot locations.

23. The assembly of claim 19, wherein:
the assembly further comprises a first thermal interface material between a lower surface of the heat sink and an outer surface of the cover and a second thermal interface material along an inner surface of the cover; and
the bracket includes one or more bracket surfaces including a plurality of laser weld spot locations laser welded to the cover, the one or more bracket surfaces comprising one or more generally flat planar surfaces that abut against and are generally perpendicular to corresponding portions of the EMI shield.

* * * * *